United States Patent [19]
Zeidler et al.

[11] Patent Number: 5,055,424
[45] Date of Patent: Oct. 8, 1991

[54] METHOD FOR FABRICATING OHMIC CONTACTS ON SEMICONDUCTING DIAMOND

[75] Inventors: James R. Zeidler; Khosrow L. Moazed, both of San Diego, Calif.

[73] Assignee: The United States of America as represented by the Secretary of the Navy, Washington, D.C.

[21] Appl. No.: 374,498

[22] Filed: Jun. 29, 1989

[51] Int. Cl.$^5$ ............................................. H01L 31/13
[52] U.S. Cl. .................................... 437/188; 437/192; 437/193; 437/194
[58] Field of Search ............................ 437/192-195, 437/188

[56] References Cited

U.S. PATENT DOCUMENTS 3,611,064 10/1971 Hall et al. ............................. 357/17
4,443,653 4/1984 Catalano et al. ....................... 437/4

OTHER PUBLICATIONS

Moazed et al., "Electrical Contacts to Semiconducting Diamond", Proc. High Frequency Power Conversion Conf., May 1989.

Primary Examiner—Olik Chaudhuri
Assistant Examiner—Andrew Griffin
Attorney, Agent, or Firm—Harvey Fendelman; Thomas Glenn Keough; Michael A. Kagan

[57] ABSTRACT

A method is disclosed for fabricating ohmic contacts on semiconducting diamond. A carbide forming metal is deposited over a surface of the semiconducting diamond. In some applications, one or more layers of an intermediate metal are deposited over the carbide forming metal. A corrosion resistant metal is then deposited over the intermediate metal, if present, or the carbide forming metal. The semiconducting diamond and metals are heated in an inert environment at a temperature anywhere from 350 to 1200 degrees Celsius.

34 Claims, 2 Drawing Sheets

METHOD FOR FABRICATING OHMIC CONTACTS ON SEMICONDUCTING DIAMOND

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of fabricating ohmic contacts on a semiconductor, and more particularly to fabricating ohmic contacts on semiconducting diamond.

The possibility of growing epitaxial layers of semiconducting diamond has generated a resurgence of interest in developing applications of this unique material for microelectronic devices. That uniqueness is, perhaps, best exemplified by the fact that diamond possesses high elastic modulus, high thermal conductivity, low dielectric constant, optical transparency over a wide spectral region, and a superior resistance to chemical attack and to thermal or radiation damage. Further, based on theoretical predictions, exceptionally high saturated carrier velocities for both electrons and holes over a wide range of applied voltages may be achievable in diamond devices. These exceptional properties suggest the potential of diamond as a material useful in severe environments where present state-of-the-art semiconductor devices are not practical or effective, as for example, high temperature (>400° C.) environments, chemically corrosive environments, outer space, and environments subject to radiation exposure, as are found in nuclear reactors.

Semiconductor devices require ohmic contacts to provide reliable operation and controlled outputs. Therefore, a process that could produce ohmic contacts on semiconducting diamond and be implemented on a mass production basis would enable semiconducting devices to be employed in many new applications.

Contacts have been formed to both natural and synthetic diamond for a variety of measurements of the physical properties of these materials, as for example, photoconductivity and electrical transport. Further, the utilization of diamond for nuclear radiation detectors, light sensitive switches, and high temperature thermistor elements has required the fabrication of contacts onto diamond. Three methods have been used to fabricate such contacts, but each has performance and other limitations which makes them unsuitable for use in a mass production environment or for utilization at elevated temperatures.

The first method requires a roughened diamond surface. When metal is placed in contact with a mechanically damaged area of diamond such as a crack, a corner, or a region that is deliberately roughened, acceptable electrical contact may be attained. Electrical transport and infrared photoconductivity measurements were made successfully using colloidal graphite or silver paint contacts on roughened diamond surfaces, or point contacts on the edge of a polished diamond block. However, silver paint and colloidal graphite contacts are mechanically fragile and electrically noisy. The rough surface features and the large concentrations of surface defects that were present on the early synthetic semiconducting diamonds allowed electrical transport measurements to be made using point contacts. These contacts were reported to be non-ohmic and partially rectifying, but far superior to similar contacts formed on natural diamond. However, contacts produced by this method have poor reliability and lack mechanical integrity, making them unsuitable for use in adverse environments.

The second method relies on the reaction of the diamond with a molten alloy. It has been suggested that transition metal/corrosion resistant metal alloys, in the molten state, will etch the diamond surface, form a low resistivity transition metal carbide and diffuse the corrosion resistant metal into the diamond. This technique was used to form thermistor elements from natural semiconducting diamond with a copper-silver-titanium alloy. Gold-tantalum and gold-tantalum-aluminum alloys have also been used to form electrical contacts to natural insulating and semiconducting diamond surfaces by electron beam welding and by direct joule heating. This process provides very poor control of the contact dimensions, which necessarily must be precise and repeatable in a mass production environment.

The third method involves graphitization of the diamond surface which provides ohmic response. Various means have been proposed for the graphitization of the diamond surface and the means for making contact to the graphite layer. However, each graphite layer has different thermal and chemical properties than the underlying diamond. Therefore, this process does not produce contacts suitable for high temperature applications.

All of these processes produce contacts having resistance values which are difficult to predict, and none are compatible with standard photolithographic processes. Contacts formed by any of these methods are not able to withstand the operating conditions for which diamond devices would be potentially suitable: elevated temperatures, high current densities, high frequencies, and exposure to intense radiation. Contacts formed by these methods have high contact resistances and are noisy.

Thus, a need exists for a method capable of being implemented on a mass production scale that produces ohmic contacts on semiconducting diamond. Therefore, an object of the present invention to provide a method for manufacturing relatively low resistance ohmic contacts on semiconducting diamond. Another object of the present invention is to provide a method for producing low resistance ohmic contacts on semiconducting diamond that is compatible with conventional processing techniques. A further object of the present invention is to provide a method for producing low resistance ohmic contacts having resistances within a predictable range of values on semiconducting diamond. Still yet another object of the present invention is to provide a method for manufacturing relatively low resistance ohmic contacts on semiconducting diamond with precise and repeatable dimensional control of the contact dimensions.

SUMMARY OF THE INVENTION

The present invention overcomes the limitations of earlier methods of forming contacts on semiconducting diamond and provides a method for mass fabrication of low resistance ohmic contacts on semiconducting diamond. The ohmic contacts formed by this method have predictable resistances and good mechanical integrity. Furthermore, this process can be combined with standard mass production techniques such as photolithography, electron beam lithography, and x-ray beam lithography to produce ohmic contacts having repeatable dimensions with precision tolerances for applications which include micron and submicron devices.

The present invention includes depositing a carbide forming metal over a surface of semiconducting diamond. In some applications, one or more layers of an intermediate metal are deposited over the carbide forming metal. A corrosion resistant metal is then deposited over the intermediate metal, if present, or directly onto the carbide forming metal. The semiconducting diamond and metals are heated in an inert environment at a temperature anywhere from 350 to 1200 degrees Celsius, where the environment is inert to the metals.

FIG.'s 4–11 are cross-sectional views of stages in the fabrication of ohmic contacts on a semiconducting diamond surface using methods of photolithography.

DESCRIPTION OF THE PREFERRED EMBODIMENT

Figure 1:
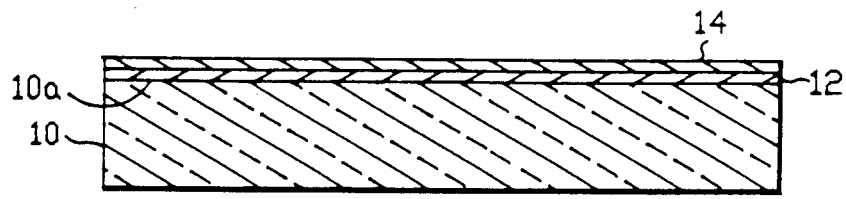
FIG. 1 is a cross-sectional view of a corrosion resistant metal that is deposited over a carbide forming metal that in turn is deposited onto a semiconducting diamond surface.

Referring to FIG. 1, semiconducting diamond 10 having surface 10a is placed in an ultrahigh vacuum system (not shown) having an electron beam heating source. Such systems are well known and commonly used in this field of technology. The system was modified to also include an electric resistance heat source. The electron beam heating source vaporizes carbide forming metal 12, causing it to be deposited as a film over surface 10a, as shown in FIG. 1. Suitable carbide forming metals include tungsten, molybdenum, chromium, vanadium, niobium, tantalum, titanium, nickel, cobalt, iron, manganese, aluminum, silicon, boron, zirconium, and hafnium. The electric resistance heat source then vaporizes corrosion resistant metal 14, causing it to be deposited as a film over carbide forming metal 12. Suitable corrosion resistant metals include: gold, platinum, palladium, iridium, silver, nickel, chromium, and copper. These corrosion resistant metals protect the underlying carbide forming metal. The technique of vaporizing and depositing metal over a surface is generally referred to as vapor deposition and is well known by those skilled in this technology. Therefore, it is to be understood that the scope of the invention also includes vaporizing the metals with other types of vaporizing sources than those specifically identified herein, as for example, by lasers.

Figure 2:
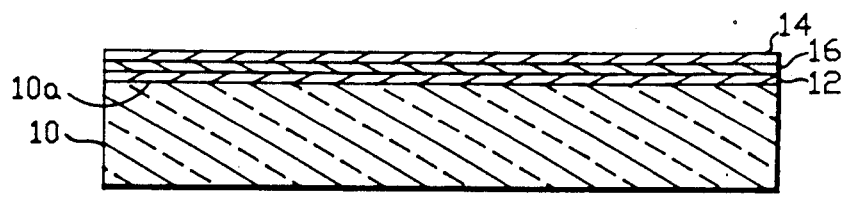
FIG. 2 is a cross-sectional view of layers of a corrosion resistant metal, intermediate metal, and carbide forming metal deposited over a semiconducting diamond surface.

Referring to FIG. 2, the procedure described immediately above may be modified, depending on the particular end-use application, by vaporizing and depositing one or more layers of intermediate metals 16 over carbide forming metal 12 and then depositing corrosion resistant metal 14 over intermediate metals 16. Intermediate metals 16 may be vaporized with either the electron beam source or with the electrical resistance heating source. Each layer of intermediate metal 16 may be a different metal. Intermediate metals 16 serve as bonding agents to assure good mechanical integrity between metals 12 and 14 by creation of metal alloys having reasonable solid-state solubility between themselves at the interface of each pair of juxtaposed metals 12, 14, and 16, where ordinarily, carbide forming metal 12 and corrosion resistant metal 14 would not bond well. Thus, each intermediate metal 16 must have reasonable solid-state solubility with the metal it is sandwiched between, i.e., between two intermediate metals, between a carbide forming metal and another intermediate metal, or between another intermediate metal and a corrosion resistant metal. In some applications, intermediate metal 16 is used as a diffusion barrier to prevent alloying of carbide forming metal 12 with corrosion resistant metal 14. Suitable intermediate metals include: tungsten, molybdenum, chromium, vanadium, niobium, tantalum, titanium, nickel, cobalt, iron, manganese, aluminum, silicon, boron, zirconium, and hafnium, gold, platinum, palladium, iridium, silver, and copper, although it is to be understood that the scope of the invention also includes use of other intermediate metals not specifically identified herein, as are found in the Periodic Table of Elements.

By way of example, ohmic contacts have been fabricated on semiconducting diamond utilizing the following combinations of carbide forming metal 12, intermediate metals 16, or corrosion resistant metal 14: titanium/gold, titanium/platinum, molybdenum, molybdenum/gold, molybdenum/nickel/gold, tantalum, and tantalum/gold. It is to be understood that the present invention comprehends the utilization of other combinations of metals besides those identified above which may include of metals not specifically listed herein.

The thickness of the film of carbide forming metal were in the range of 5 to 50 nm. Films of intermediate and corrosion resistant metals 16 and 14, respectively, ranged in thickness from 10 to 500 nm. The thicknesses of these films are given by way of example only. It is to be understood that the scope of the invention also comprehends metal thicknesses other than as specifically recited. The separate heating sources in the vacuum system make it possible to vaporize combinations of carbide forming, intermediate, or corrosion resistant metals sequentially or simultaneously, and to produce abrupt and graded interfaces between layers of metal.

Next, semiconducting diamond 10 and carbide forming metal 12, intermediate metal 16 (if present), and corrosion resistant metal 14 are placed within an environment inert to carbide forming metal 12, corrosion resistant metal 14, and intermediate metal 16 (if present), and are heated preferably to between 350° to 1200° C. for a period which may vary depending on the desired end results. Such an inert environment may be a hard vacuum, or consist of gasses which may include dry hydrogen, dry nitrogen, dry argon, or dry helium, although other gasses or mixtures of gasses which provide an inert environment are within the scope of the invention. The step of heating transforms carbide forming metal 12, intermediate metal 16 (if present), and corrosion resistant metal 14 overlying semiconducting diamond surface 10a into an ohmic contact. The inert gas prevents oxidation of metals 12, 14, and 16 while they are being heated. By way of example, good results have been obtained where the inert gas is hydrogen and corrosion resistant metal 18 is gold. However, other suitable gases include dry argon and dry nitrogen.

It is hypothesized that during heating, carbide nucleation occurs around the interface of carbide forming metal 12 and diamond surface 10a. The carbide nucleation formation penetrates through surface 10a and also into metal 12.

Heating also performs another important function by creating metal alloys at each of the interfaces of juxtaposed metals 12, 14, and 16 (if present) due to diffusion of the atoms of the juxtaposed metals into one another. The alloying of the metals provides an ohmic contact having good mechanical integrity. An example of an ohmic contact fabricated on semiconducting diamond by the process described above, where carbide forming metal 12 is molybdenum, intermediate metal 16 is nickel, and corrosion resistant metal 14 is gold, the following would be found starting with the semiconducting diamond: carbon; molybdenum carbide; molybdenum; an alloy formed of molybdenum and nickel; nickel; an alloy formed of nickel and gold; and gold.

Figure 3:
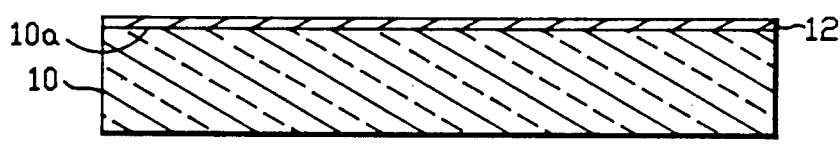
FIG. 3 is a cross-sectional view of a carbide forming metal deposited onto a semiconducting diamond surface.

For applications such as outer space with an absence of oxygen and water, whether solid, liquid, or gas, deposition of corrosion resistant metal 14 onto carbide forming metal 12 would not be necessary. In this case, as shown in FIG. 3, carbide forming metal 12 is deposited, as for example by vapor deposition, onto surface 10a of semiconducting diamond 10 in the ultrahigh vacuum system described above. Semiconducting diamond 10 and carbide forming metal 12 then are heated in an inert environment to a temperature which may range from 350° to 1200° C. for a period which may vary depending upon the desired end results.

The processes described above result in the fabrication of a monolithic ohmic contact onto the surface of semiconducting diamond. However, it is to be understood that the scope of the invention also comprehends utilization of this process for fabricating discrete ohmic contacts on the surface of semiconducting diamond. This process could be readily employed to manufacture discrete ohmic contacts onto semiconducting diamond in conjunction with techniques that are well known to those skilled in this technology. For example, discrete ohmic contacts could be fabricated by shielding specific regions of semiconducting diamond surface 10a, as for example with a mesh screen or plates. If it is desired to fabricate discrete ohmic contacts to very small dimensions with precise tolerances, the present invention may be practiced, for example, in conjunction with well known, standard techniques of photolithography, electron bean lithography, or x-ray lithography. Techniques for fabricating discrete ohmic contacts at the micron level onto semiconducting diamond that employ the methods of the present invention and that also incorporate standard, photolithographic processes are described below, and are offered by way of example.

Figure 4:
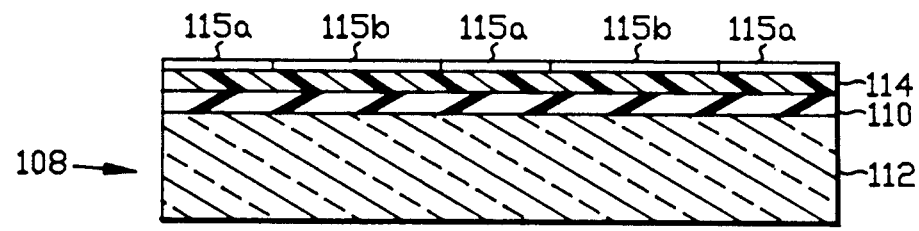

Referring to FIG. 4, where there is shown the initial stage of development of device 108 which will ultimately have ohmic contacts, an electrically insulating buffer 110 having high temperature (1200° C.) resistance, which may have a thickness of 0.15 to 0.2 μm, is grown on cleaned surface 112a of semiconducting diamond 112, as for example, by chemical vapor deposition. Suitable materials for insulating buffer 110 may include silicon nitride, silicon dioxide, and silicon oxynitride. Next, photoresist 114 is spun onto insulating buffer 110. Pattern mask 115, having a pattern of substantially transparent areas 115a and substantially opaque areas 115b, is mechanically held on photoresist 114. Photoresist 114 then is exposed to light transmitted through transparent areas 115a of pattern mask 115 so that its pattern is imprinted onto photoresist 114. For example, the light may include ultraviolet light, visible light, or near-infrared light, depending on the type of photoresist used and the dimensional requirements of the ohmic contacts being fabricated. However, it is to be understood that the scope of the invention includes utilization of light having wavelengths other than the types of light specifically mentioned herein. Pattern mask 115 then is physically lifted off of photoresist 114.

Figure 5:
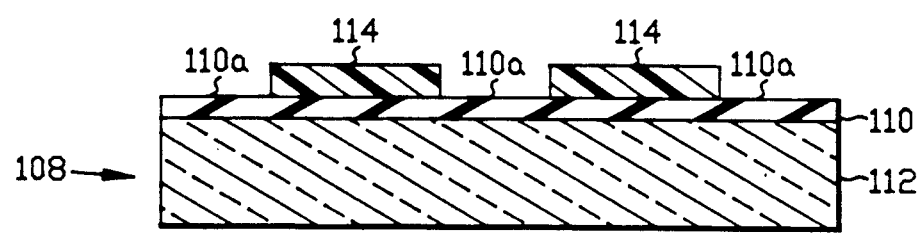
Figure 6:
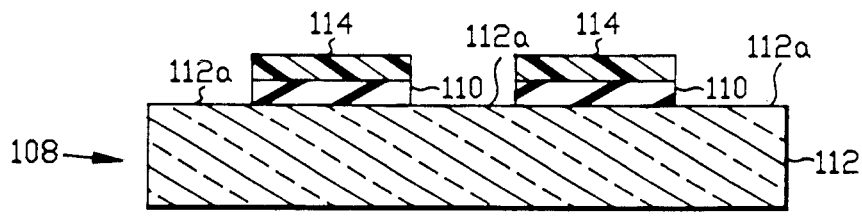

Next, portions of photoresist 114 that were exposed to the light are developed and removed, as shown in FIG. 5, in order to expose selected areas 110a of insulating buffer 110. However, it is to be understood that the scope of the invention includes the alternative step of developing and removing portions of photoresist 114 that received greatly diminished exposure to the light and allowing the exposed portions of photoresist 114 to remain. These alternative procedures are well known to those skilled in photolithography. Referring to FIG. 6, sections of insulating buffer 110 having exposed surfaces 110a are removed by chemical etching, thereby exposing regions of diamond surface 112a.

Figure 7:
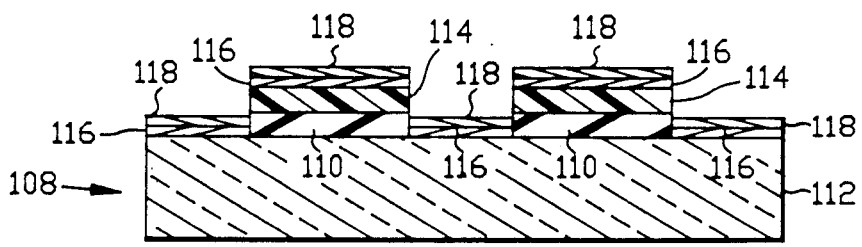

Next, in-process device 108, as depicted in either of FIG.'s 9 or 10, is placed in the ultrahigh vacuum system (not shown), as previously described above, having an electron beam heated source. Referring to FIG. 7 the electron beam evaporated source vaporizes carbide forming metal 116, causing it to be deposited over in-process device 108. The electric resistance heating source then vaporizes corrosion resistant metal 118, causing it to be deposited over carbide forming metal 116. Suitable carbide forming and corrosion resistant metals 116 and 118, respectively, were previously identified above. Corrosion resistant metal 118 prevents oxidation of the underlying carbide forming metal 116.

Figure 8:
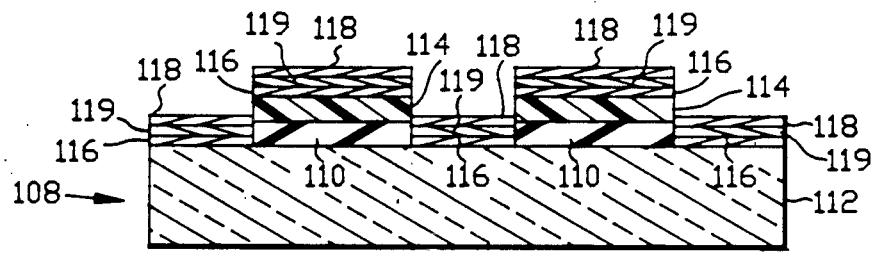

Referring to FIG. 8, the metal deposition step described in the immediately preceding paragraph may be modified, depending upon the end use application, by vaporizing and depositing one or more layers of intermediate metals 119 over carbide forming metal 116 and then depositing corrosion resistant metal 118 over the intermediate metals. Intermediate metals 119 may be vaporized with either the electron beam source or with the electrical resistance heated source. Each layer of intermediate metal 119 may be a different metal. Suitable intermediate metals were identified above.

Figure 9:
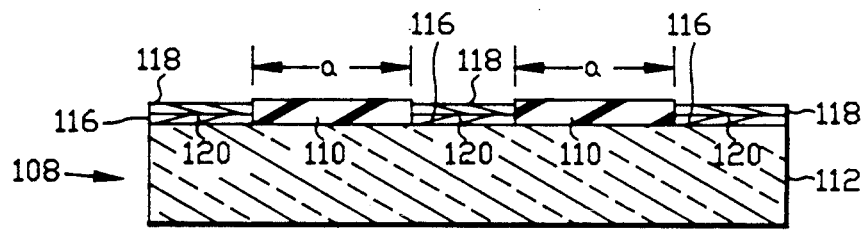
Figure 10:
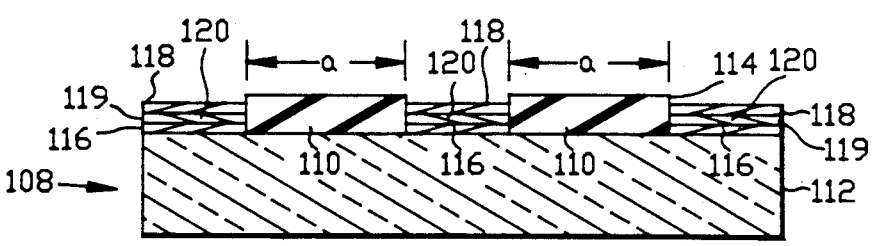

After deposition of metals 116 and 118, photoresist 114 is chemically removed, thereby also removing metals 116 and 118 previously overlying photoresist 114, as illustrated in FIG. 9. Afterwards, metal pads 120, formed of remaining metals 116 and 118 constitute the only metals on device 108. Similarly, in the case after which metals 116, 119, and 118 have been deposited, photoresist 114 is chemically removed, thereby also removing metals 116, 119, and 118 previously overlying photoresist 114, as illustrated in FIG. 10.

Figure 11:
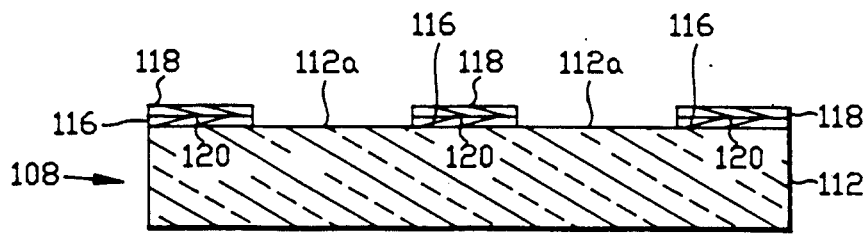

Next, in-process device 108 is placed within an environment inert to carbide forming metal 116, intermediate metal 119 (if present), and corrosion resistant metal 118, and is heated preferably anywhere from 350° to 1200° C. for a period which may vary depending on the desired end results to transform the metal into ohmic contacts 120. After heating, insulating buffer 110 may be removed from device 108 to expose semiconducting diamond surface 110a, as for example, by chemical etching. An example of this step is illustrated in FIG. 11 with respect to device 108 as illustrated in FIG. 9.

The data listed in Tables I and II presents resistances of ohmic contacts fabricated by the photolithographic method described above. Table I data presents the effect of heating time on room temperature resistance at a temperature of 950° C. where molybdenum is carbide forming metal 16. Table II lists similar data for a molybdenum/nickel/gold film. The reference to "pad spacing" in these tables refers to the distance a. between pads 20. shown in FIG.'s 9 and 10. As is clearly apparent from these data, as the isothermal heating time increases, the resistance decreases to a minimum value and then increases upon further exposure to temperature. It is to be noted that the measured resistance between pads 20 prior to heating was 8 to 10 orders of magnitude higher than the values listed in Tables I and II. Furthermore, the pre-heating resistances were non-ohmic. The results also show that minimum resistance is achieved prior to the formation of a continuous carbide film that would isolate the unreacted metal from the diamond.

Obviously, many modifications and variations of the present invention are possible in light of the above teachings. For example, the process of the present invention could be used in conjunction with standard electron beam or x-ray lithographic techniques to fabricate ohmic contacts onto semiconducting diamond at the submicron level. Therefore, it is to be understood that within the scope of the appended claims the invention may be practiced otherwise than as specifically described.

TABLE I

THE EFFECT OF TIME OF HEATING AT 950° C. ON THE ROOM TEMPERATURE RESISTANCE OF MOLYBDENUM CONTACTS FOR VARIOUS PAD SPACINGS
ROOM TEMPERATURE RESISTANCE (K ohms)

| Heating Time | Pad Spacing (μm) | | | | |
|---|---|---|---|---|---|
| (min.) | 5 | 10 | 20 | 30 | 50 |
| 2 | 9 | 25 | 48 | 108 | 167 |
| 4 | 2.4 | 4.5 | 8.0 | 15 | 24 |
| 8 | 3.0 | 2.8 | 3.8 | 4.7 | 6.7 |
| 16 | 5.3 | 7.1 | 8.5 | 8.3 | 11.1 |

TABLE II

THE EFFECT OF TIME OF HEATING AT 950° C. ON THE ROOM TEMPERATURE RESISTANCE OF MOLYBDENUM/NICKEL/GOLD CONTACTS FOR VARIOUS PAD SPACINGS
ROOM TEMPERATURE RESISTANCE (k ohms)

| Heating Time | Pad Spacing (μm) | | | | |
|---|---|---|---|---|---|
| (min.) | 5 | 10 | 20 | 30 | 50 |
| 2 | 3.3 | 8.0 | 21.6 | 29.6 | 48.8 |
| 4 | 2.9 | 6.1 | 22.2 | 30.8 | 50.0 |
| 8 | 0.6 | 1.1 | 4.1 | 5.6 | 6.3 |
| 16 | 10.5 | 9.1 | 9.6 | 12.5 | 15.4 |

We claim:

1. A method of fabricating ohmic contacts on semiconducting diamond comprising the steps of:
   depositing a carbide forming metal over an exposed surface of said semiconducting diamond;
   depositing a corrosion resistant metal over said carbide forming metal; and
   heating said semiconducting diamond, said carbide forming metal, and said corrosion resistant metal in an environment inert to said carbide forming and corrosion resistant metals at a temperature ranging from 350 to 1200 degrees Celsius.

2. The process of claim 1 wherein:
   said carbide forming metal is selected from the group consisting of tungsten, molybdenum, chromium, vanadium, niobium, tantalum, titanium, nickel, cobalt, iron, manganese, aluminum, silicon, boron, zirconium, and hafnium; and
   said corrosion resistant metal is selected from the group consisting of gold, platinum, palladium, iridium, silver, copper, nickel, and chromium.

3. The process of claim 2 wherein:
   the step of depositing said carbide forming metal is accomplished by vapor deposition.

4. The process of claim 2 wherein:
   the step of depositing said corrosion resistant metal is accomplished by vapor deposition.

5. A method of fabricating ohmic contacts on semiconducting diamond comprising the steps of:
   depositing a carbide forming metal over an exposed surface of said semiconducting diamond;
   depositing at least one layer of an intermediate metal over said carbide forming metal;
   depositing a corrosion resistant metal over said intermediate metal; and
   heating said semiconducting diamond, said carbide forming metal, said intermediate metal, and said corrosion resistant metal in an environment inert to said carbide forming, intermediate, and corrosion resistant metals and at a temperature ranging from 350 to 1200 degrees Celsius.

6. The process of claim 5 wherein
   said carbide forming metal is selected from the group consisting of tungsten, molybdenum, chromium, vanadium, niobium, tantalum, titanium, nickel, cobalt, iron, manganese, aluminum, silicon, boron, zirconium, and hafnium; and
   said corrosion resistant metal is selected from the group consisting of gold, platinum, palladium, iridium, silver, copper, nickel, and chromium.

7. The process of claim 6 wherein:
   said intermediate metal is selected from the group consisting of tungsten, molybdenum, chromium, vanadium, niobium, tantalum, titanium, nickel, cobalt, iron, manganese, aluminum, silicon, boron, zirconium, and hafnium, gold, platinum, palladium, iridium, silver, and copper.

8. The process of claim 7 wherein:
   the step of depositing said carbide forming metal is accomplished by vapor deposition.

9. The process of claim 7 wherein:
   the step of depositing said corrosion resistant metal is accomplished by vapor deposition.

10. The process of claim 7 wherein:
    the step of depositing said intermediate metal is accomplished by vapor deposition.

11. A method of fabricating ohmic contacts on semiconducting diamond comprising the steps of:
    forming a film of an insulating buffer on a surface of said semiconducting diamond;
    forming a layer of photoresist over said insulating buffer;
    placing a pattern mask having a pattern of substantially opaque and transparent areas over said photoresist layer;
    exposing selected portions of said photoresist to light transmitted through said transparent areas of said pattern;
    lifting said pattern mask off of said photoresist;

removing said selected portions of said photoresist exposed to said light in order to expose said insulating buffer previously overlain by said selected portions of said photoresist;

removing portions of said insulating buffer previously overlain by said portions of said photoresist exposed to said light in order to expose selected areas of said semiconducting diamond surface;

depositing a carbide forming metal over said exposed selected areas of said surface of said semiconducting diamond, said carbide forming metal selected from the group consisting essentially of tungsten, molybdenum, chromium, vanadium, niobium, tantalum, titanium, nickel, cobalt, iron, manganese, aluminum, silicon, boron, zirconium, and hafnium;

depositing a corrosion resistant metal over said carbide forming metal, said corrosion resistant metal selected from the group consisting essentially of gold, platinum, palladium, iridium, silver, copper, nickel, and chromium;

removing said photoresist so that said carbide forming and corrosion resistant metals overlying said photoresist are removed; and heating said semiconducting diamond, said carbide forming metal, and said corrosion resistant metal to a temperature ranging from 350 to 1200 degrees Celsius in an environment inert to said carbide forming and corrosion resistant metals.

12. The process of claim 11 which further includes the step of:
   removing remaining portions of said insulating buffer from said surface of said diamond.

13. The process of claim 12 wherein:
   said insulating buffer is a material selected from a group consisting essentially of silicon nitride, silicon dioxide, and silicon oxynitride.

14. The process of claim 13 wherein:
   the step of depositing said carbide forming metal is accomplished by vapor deposition.

15. The process of claim 13 wherein:
   the step of depositing said corrosion resistant metal is accomplished by vapor deposition.

16. A method of fabricating ohmic contacts on semiconducting diamond comprising the steps of:
   forming a film of an insulating buffer on a surface of said semiconducting diamond;
   forming a layer of photoresist over said insulating buffer;
   placing a pattern mask having a pattern of substantially opaque and transparent areas over said photoresist layer;
   exposing selected portions of said photoresist to light transmitted through said transparent areas of said pattern to transform said photoresist exposed to said light into developed photoresist;
   lifting said pattern mask off of said photoresist;
   removing said selected portions of said photoresist exposed to said light in order to expose said insulating buffer previously overlain by said selected portions of said photoresist in order to expose selected areas of said semiconducting diamond surface;
   removing portions of said insulating buffer previously overlain by said photoresist exposed to said light in order to expose selected areas of said semiconducting diamond surface;
   depositing a carbide forming metal over said exposed selected areas of said surface of said semiconducting diamond, said carbide forming metal selected from the group consisting essentially of tungsten, molybdenum, chromium, vanadium, niobium, tantalum, titanium, nickel, cobalt, iron, manganese, aluminum, silicon, boron, zirconium, and hafnium;
   depositing at least one layer of an intermediate metal over said carbide forming metal;
   depositing a corrosion resistant metal over said intermediate metal, said corrosion resistant metal selected from the group consisting essentially of gold, platinum, palladium, iridium, silver, copper, nickel, and chromium;
   removing said photoresist so that said carbide forming, intermediate, and corrosion resistant metals overlying said photoresist are removed; and
   heating said semiconducting diamond, said carbide forming metal, said intermediate metal, and said corrosion resistant metal to a temperature from 350 to 1200 degrees Celsius in an environment inert to said carbide forming, intermediate, and corrosion resistant metals.

17. The process of claim 16 which further includes the step of:
   removing remaining portions of said insulating buffer from said surface of said diamond.

18. The process of claim 17 wherein:
   said insulating buffer is a material selected from a group consisting essentially of silicon nitride, silicon dioxide, and silicon oxynitride.

19. The process of claim 18 wherein:
   said intermediate metal is selected from the group of tungsten, molybdenum, chromium, vanadium, niobium, tantalum, titanium, nickel, cobalt, iron, manganese, aluminum, silicon, boron, zirconium, and hafnium, gold, platinum, palladium, iridium, silver, and copper.

20. The process of claim 19 wherein: the step of depositing said carbide forming metal is accomplished by vapor deposition.

21. The process of claim 19 wherein:
   the step of depositing said corrosion resistant metal is accomplished by vapor deposition.

22. The process of claim 19 wherein:
   the step of depositing said intermediate metal is accomplished by vapor deposition.

23. A method of fabricating ohmic contacts on semiconducting diamond comprising the steps of:
   forming a film of an insulating buffer on a surface of said semiconducting diamond;
   forming a layer of photoresist over said insulating buffer;
   placing a pattern mask having a pattern of substantially opaque and transparent areas over said photoresist layer;
   exposing selected portions of said photoresist to light transmitted through said transparent areas of said pattern so that said photoresist includes unexposed portions of said photoresist;
   lifting said pattern mask off of said photoresist;
   removing said unexposed portions of said photoresist in order to expose said insulating buffer previously overlain by said unexposed portions of said photoresist;
   removing portions of said insulating buffer previously overlain by said unexposed portions of said photoresist in order to expose selected areas of said semiconducting diamond surface;
   depositing a carbide forming metal over said exposed selected areas of said surface of said semiconducting diamond; said carbide forming metal selected from the group consisting essentially of tungsten, molybdenum, chromium, vanadium, niobium, tantalum, titanium, nickel, cobalt, iron, manganese, aluminum, silicon, boron, zirconium, and hafnium;

depositing a corrosion resistant metal over said carbide forming metal, said corrosion resistant metal selected from the group consisting essentially of gold, platinum, palladium, iridium, silver, copper, nickel, and chromium;

removing remaining portions of said photoresist so that said carbide forming and corrosion resistant metals overlying said photoresist are removed; and heating said semiconducting diamond, said carbide forming metal, and said corrosion resistant metal to a temperature ranging from 350 to 1200 degrees Celsius in an environment inert to said carbide forming and corrosion resistant metals.

24. The process of claim 23 which further includes the step of:

removing remaining portions of said insulating buffer from said surface of said diamond.

25. The process of claim 24 wherein:

said insulating buffer is a material selected from a group consisting essentially of silicon nitride, silicon dioxide, and silicon oxynitride.

26. The process of claim 25 wherein:

the step of depositing said carbide forming metal is accomplished by vapor deposition.

27. The process of claim 25 wherein:

the step of depositing said corrosion resistant metal is accomplished by vapor deposition.

28. A method of fabricating ohmic contacts on semiconducting diamond comprising the steps of:

forming a film of an insulating buffer on a surface of said semiconducting diamond;

forming a layer of photoresist over said insulating buffer;

placing a pattern mask having a pattern of substantially opaque and transparent areas over said photoresist layer;

exposing selected portions of said photoresist to light transmitted through said transparent areas of said pattern so that said photoresist includes unexposed portions of said photoresist;

lifting said pattern mask off of said photoresist;

removing said unexposed portions of said photoresist in order to expose said insulating buffer previously overlain by said unexposed portions of said photoresist;

removing portions of said insulating buffer previously overlain by said unexposed portions of said photoresist in order to expose selected areas of said semiconducting diamond surface;

depositing a carbide forming metal over said exposed selected areas of said surface of said semiconducting diamond, said carbide forming metal selected from the group consisting essentially of tungsten, molybdenum, chromium, vanadium, niobium, tantalum, titanium, nickel, cobalt, iron, manganese, aluminum, silicon, boron, zirconium, and hafnium;

depositing at least one layer of an intermediate metal over said carbide forming metal;

depositing a corrosion resistant metal over said intermediate metal, said corrosion resistant metal selected from the group consisting essentially of gold, platinum, palladium, iridium, silver, copper, nickel, and chromium;

removing remaining portions of said photoresist so that said carbide forming, intermediate, and corrosion resistant metals overlying said photoresist are removed;

heating said semiconducting diamond, said carbide forming metal, said intermediate metal, and said corrosion resistant metal to a temperature ranging from 350 to 1200 degrees Celsius in an environment inert to said carbide forming, intermediate, and corrosion resistant metals.

29. The process of claim 28 which further includes the step of:

removing remaining portions of said insulating buffer from said surface of said diamond.

30. The process of claim 29 wherein:

said insulating buffer is a material selected from a group consisting essentially of silicon nitride, silicon dioxide, and silicon oxynitride.

31. The process of claim 30 wherein:

said intermediate metal is selected from the group of tungsten, molybdenum, chromium, vanadium, niobium, tantalum, titanium, nickel, cobalt, iron, manganese, aluminum, silicon, boron, zirconium, and hafnium, gold, platinum, palladium, iridium, silver, and copper.

32. The process of claim 31 wherein:

the step of depositing said carbide forming metal is accomplished by vapor deposition.

33. The process of claim 31 wherein:

the step of depositing said corrosion resistant metal is accomplished by vapor deposition.

34. The process of claim 31 wherein:

the step of depositing said intermediate metal is accomplished by vapor deposition.

* * * * *